United States Patent
Jacob et al.

(10) Patent No.: US 10,838,851 B2
(45) Date of Patent: Nov. 17, 2020

(54) MULTI-DIMENSIONAL ACCESSES IN MEMORY

(71) Applicant: International Business Machines Corporation, Armonk, NY (US)

(72) Inventors: Philip Jacob, Congers, NY (US); Kyu-Hyoun Kim, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/288,509

(22) Filed: Feb. 28, 2019

(65) Prior Publication Data
US 2020/0278923 A1 Sep. 3, 2020

(51) Int. Cl.
G11C 8/02 (2006.01)
G06F 12/02 (2006.01)
G06F 17/16 (2006.01)
G11C 7/10 (2006.01)

(52) U.S. Cl.
CPC .......... G06F 12/0207 (2013.01); G06F 17/16 (2013.01); G11C 7/1012 (2013.01); G11C 2207/2272 (2013.01)

(58) Field of Classification Search
CPC .......... G11C 7/1012; G11C 2207/2272; G06F 12/0207; G06F 17/16
See application file for complete search history.

(56) References Cited

U.S. PATENT DOCUMENTS

| | | | | |
|---|---|---|---|---|
| 7,050,351 B2* | 5/2006 | Halbert | ................ | G11C 7/1012 365/230.03 |
| 8,441,883 B2 | 5/2013 | Catovic et al. | | |
| 8,462,571 B2* | 6/2013 | Chou | ...................... | G11C 29/06 365/149 |
| 8,521,951 B2* | 8/2013 | Rao | ........................ | G11C 15/00 711/108 |
| 9,436,655 B2 | 9/2016 | Sun et al. | | |
| 9,529,571 B2 | 12/2016 | Van Kampen et al. | | |

FOREIGN PATENT DOCUMENTS

IN 210181 B 12/2007

OTHER PUBLICATIONS

Duncan H. Lawrie, "Access and Alignment of Data in an Array Processor," IEEE Transactions on Computers, v. c-24, n.12, Dec. 1975, pp. 1145-115.
Zagha et al., "Radix Sort for Vector Multiprocessors," Proceedings of the 1991 ACM/IEEE Conference on Supercomputing, ACM, 1991, 10 pages.

(Continued)

*Primary Examiner* — Pho M Luu
(74) *Attorney, Agent, or Firm* — Daniel Morris; Otterstedt, Wallace & Kammer, LLP

(57) ABSTRACT

A method of operating a memory controller performing activation of a memory device, the method including determining a selection signal for each tile column in a memory block of the memory device by activating respective local word lines, wherein the block selection signal is determined by performing a radix n operation on a vector identifying elements to be read or written.

14 Claims, 9 Drawing Sheets

(56) References Cited

OTHER PUBLICATIONS

Yoonhu Kim et al., A Case for Exploiting Subarray-Level Parallelism (SALP) in DRAM, 2012 39th Annual International Symposium on Computer Architecture (ISCA), Jun. 9-13, 2012, pp. 1-12.
Wikipedia, Row- and column-major order, https://en.wikipedia.org/wiki/Row-_and_column-major order, Jan. 23, 2019, pp. 1-6.
Eli Bendersky, Memory layout of multi-dimensional arrays, https://eli.thegreenplace.net/2015/memory-layout-of-multi-dimensional-arrays/, Sep. 26, 2015, pp. 1-12.

* cited by examiner

*FIG. 3*

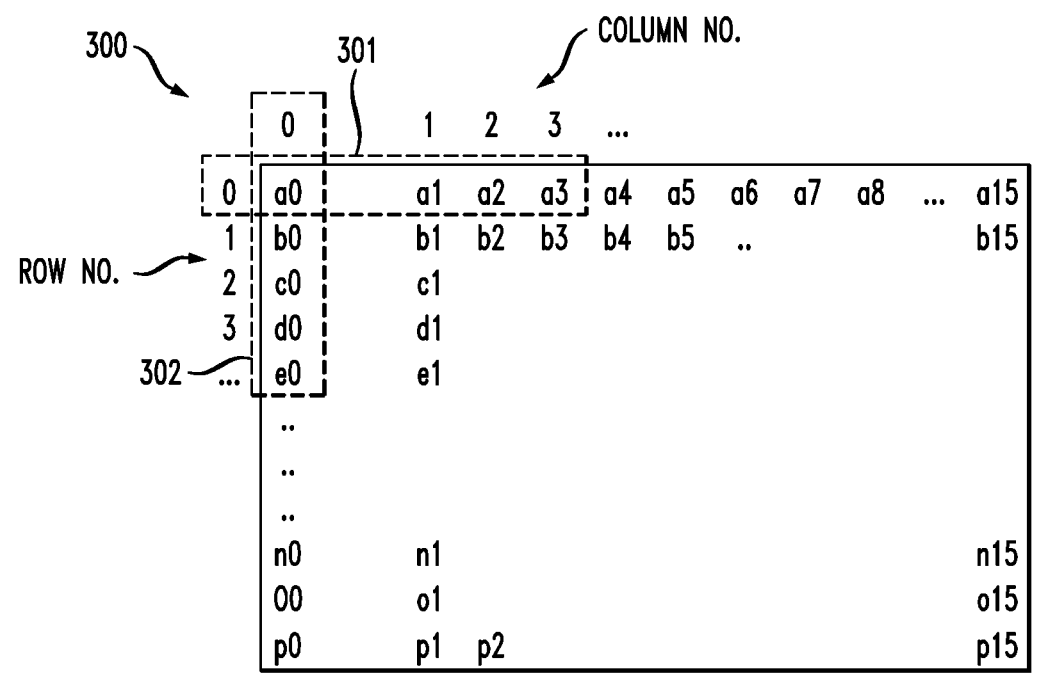

|   | 0 | 1 | 2 | 3 | ... | | | | | | |
|---|---|---|---|---|---|---|---|---|---|---|---|
| 0 | a0 | a1 | a2 | a3 | a4 | a5 | a6 | a7 | a8 | ... | a15 |
| 1 | b0 | b1 | b2 | b3 | b4 | b5 | .. | | | | b15 |
| 2 | c0 | c1 | | | | | | | | | |
| 3 | d0 | d1 | | | | | | | | | |
| ... | e0 | e1 | | | | | | | | | |
| | .. | | | | | | | | | | |
| | n0 | n1 | | | | | | | | | n15 |
| | o0 | o1 | | | | | | | | | o15 |
| | p0 | p1 | p2 | | | | | | | | p15 |

300, 301, 302, COLUMN NO., ROW NO.

MULTI-DIMENSIONAL ACCESSES IN MEMORY

The present disclosure relates generally to computer memory devices, and more particularly to a memory device and method increasing column access bandwidth.

Accessing a two dimensional matrix in Dynamic Random-Access Memory (DRAM) column wise has high latency due to constraints stemming from the way memory is designed.

More particularly, DRAM is a type of random access semiconductor memory that stores each bit of data in a separate capacitor within an integrated circuit. The capacitor can either be charged or discharged, and these two states are taken to represent the value of a bit (i.e., zero or one).

Typical DRAM systems are logically organized as a hierarchy of channels, ranks, and banks. Banks are typically the smallest memory structures that can be accessed in parallel with respect to each other. A rank is a collection of banks across multiple DRAM chips that operate in lockstep. Banks in different ranks are fully decoupled with respect to their device-level electrical operation. A channel is the collection of all banks that share a common physical link (e.g., command, address, data buses) to a processor.

While banks from a same channel can experience contention at a physical link, banks from different channels can be accessed completely independently of each other. Although DRAM offers varying degrees of parallelism at different levels of organization, two memory requests that access a same bank must be served sequentially.

DRAM banks are typically implemented as multiple sub-arrays, each sub-array having a local row-buffer. Sub-arrays within each bank share i) a global row-address decoder and ii) a set of global bit lines connecting the respective local row-buffers to a global row-buffer. The latency of a bank access may be determined by a combination of operations including i) opening a row (activation), ii) accessing requested data (e.g., reading or writing), and iii) closing the row (pre-charging). All three operations (i.e., activation, access, pre-charge) must be completed for one memory request before serving another request to a different row within the same bank.

BRIEF SUMMARY

According to an embodiment of the present invention, a method of operating a memory controller performing activation of a memory device, the method including determining a selection signal for each tile column in a memory block of the memory device by activating respective local word lines, wherein the block selection signal is determined by performing a radix n operation on a vector identifying elements to be read or written.

According to an embodiment of the present invention, a memory system comprises a memory device including a plurality of tiles, and a plurality of tile columns connecting respective sets of the tiles, wherein a bandwidth of the memory device is a function of the number of tile columns, the memory system further including a memory controller configured to access elements among the tile columns.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:
- multi-dimensional matrix data distributed in a memory array that avoids page or column resource conflict during access to the data;
- multi-dimensional matrix data distributed in a memory array that achieves high memory bandwidth;
- a method enabling simultaneous access to multiple data entries; and
- methods for independently activating segments of word lines in a sub-array.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings:

FIG. 3 depicts a view of a matrix according to an embodiment of the present invention;

DETAILED DESCRIPTION

According to one or more exemplary embodiments of the present invention, an improved memory (e.g., DRAM) enables activation of individual subarray segments to enable parallel access and provides a wide data path to the global row buffer to read out (optionally) an entire column of data in the same clock cycle.

According to one or more exemplary embodiments of the present invention, DRAM memory comprises multiple banks (e.g., 100). Each bank 100 is arranged in a two-dimensional array of tiles (e.g., 102, 103, . . . 107, . . . ). Each tile comprises a 2D array of memory cells (typically 512× 512 cells). Each tile further comprises a plurality of sense amplifiers (S/A) and sub row-decoders (sub decoders).

Within the bank 100, each row of tiles (e.g., 102-105) forms a subarray (e.g., 111). Each subarray is associated with a global word line (W/L), e.g., 106, and each tile comprises a local word line. According to one or more exemplary embodiments of the present invention, data stored in the bank 100 can be read into a global row buffer 110 via a plurality of global data lines.

According to one or more exemplary embodiments of the present invention, the row decoder 101 selectively drives the global word lines. Each global word line is used to route signals to a plurality of local word lines of the subarray.

Figure 5:
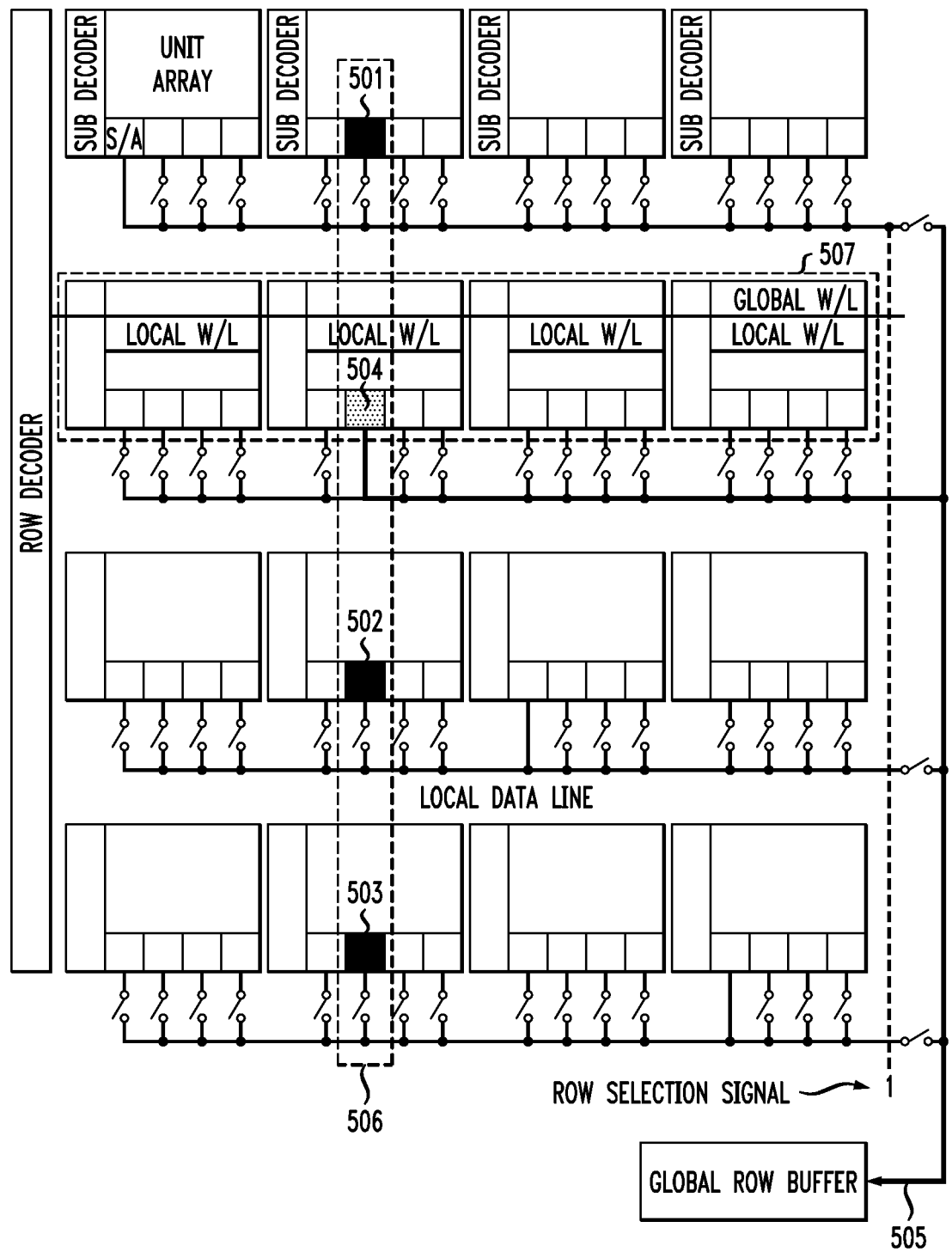
FIG. 5 illustrate a conflict in a column according to an embodiment of the present invention.

According to one or more exemplary embodiments of the present invention, a page is formed by collecting the local word lines for a given row address in all the sub-arrays in the same row in the grid. In FIG. 5 this is shown in row 2 of the grid (507) where the four local word lines together form a page. In a conventional memory array shown in FIG. 5, one (or a group of) sense-amplifier is selected from one of the tiles. Data corresponding to the selected sense-amplifier is read out serially through a global data line 505.

From each subarray, only one local word line can be activated for a read or write operation. Reading data from another local word line would require the current word line to be closed. Reading data column wise in the same subarray incurs a latency penalty to close a current page and open a new page. Subarrays arranged in the same column in the block shown in FIG. 5 share a global bit line (not shown). The global bit line prevents a simultaneous reading of multiple local word lines in the same grid column. The global bit lines are not shown in the figures to increase clarity.

According to one or more exemplary embodiments of the present invention, in a memory comprising bits arranged in a two-dimensional (2D) array (or one-dimensional (1D) vector), multi-dimensional matrix data is distributed in the memory array so that access to the data does not cause page or column resource conflict, thereby improving bandwidth of the memory. It should be understood that the bandwidth of the memory is typically measured as bytes/second, where for example, ((bytes transferred/clock cycle)*clock rate) gives the bandwidth. According to some embodiments, the method is performed by a memory controller that factors in the way 2D data is laid out in the memory, in combination with an improved memory hardware design increasing column access bandwidth.

It should be understood that 1D vector laid out in a column is a simple case of 2D matrix and hence embodiments of the present invention are also applicable to 1D vector data.

In a memory system 805 (see FIG. 8), a memory controller 802 is a digital circuit that manages the flow of data going to and from main memory 800, which is connected to the memory controller 802 by a bus 803. The memory controller can be a separate chip or integrated into a processor 804 or another chip. According to some embodiments, the bus 803 comprises command lines (cmd), address lines (addr) and data lines (data). The address lines are configured to carry an address that a command (e.g., read/write) is to be applied to. The data lines are configured to carry data to and from the memory 800.

Figure 1:
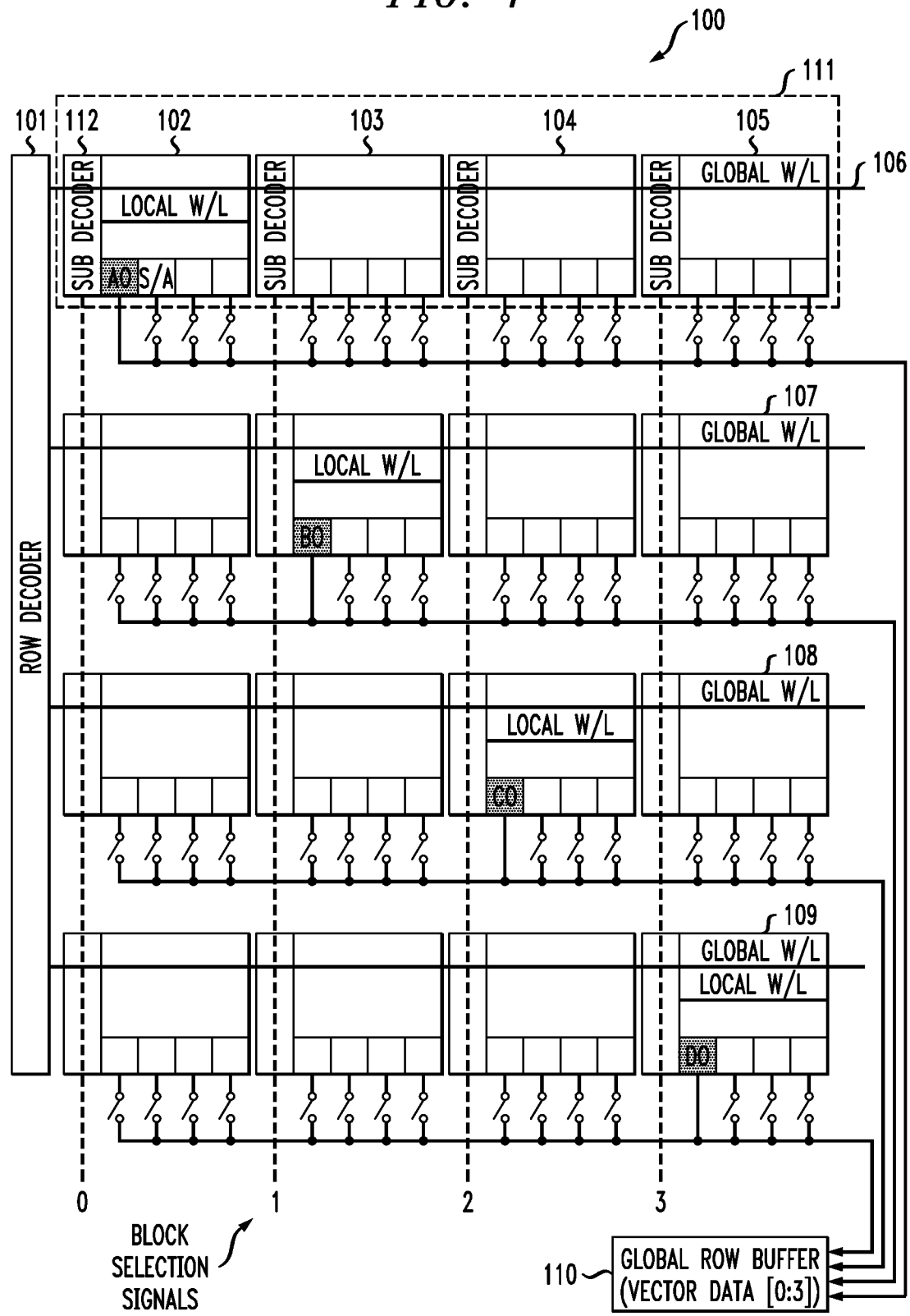
FIG. 1 depicts a view of segmented subarrays or tiles, where a row decoder activates different segments in each sub-array (row) according to an embodiment of the present invention.

FIG. 1 shows a portion of bank 100, including row decoder 101 activating different segments (i.e., A0, B0, C0 and D0) in each subarray (e.g., subarray 111) according to one or more exemplary embodiments of the present invention. According to one or more exemplary embodiments of the present invention, each subarray is a row of tiles, and each tile comprises a subarray row decoder, e.g., 112. According to some embodiments, tiles (e.g., 102-105) in a subarray (e.g., 111) are connected by a global word line (W/L) (e.g., 106). The row decoder 101 activates only one tile in each column (e.g., in FIG. 1 column 3 includes tiles 105, and 107-109).

Figure 2:
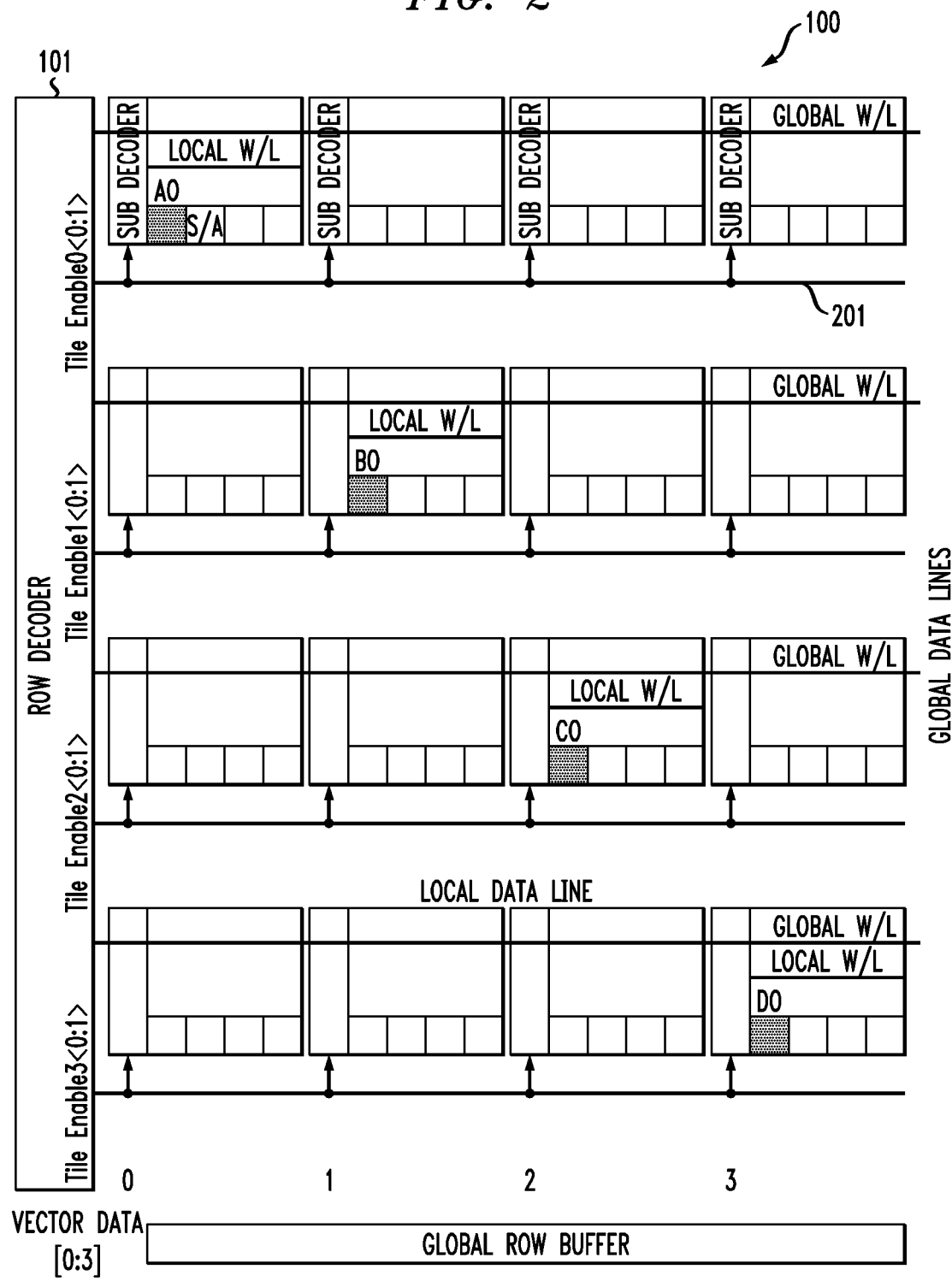
FIG. 2 depicts a view a row decoder providing tile enabling signals for each sub-array according to an embodiment of the present invention.

According to one or more exemplary embodiments of the present invention, FIG. 2 shows bank 100, including row decoder 101, where the row decoder 101 provides tile enabling signals (e.g., "tile enable0<0:1>", 201) for each subarray. According to some embodiments, different segments of word lines (i.e., local word lines) in a subarray are independently activated by the row decoder 101.

According to one or more exemplary embodiments of the present invention, a radix n+1 operation is applied to either a row or column address so data entries in a same row, or in a same column, in an original address are placed into tiles located in different rows and/or columns in a physical memory array. Given such an arrangement of data, multiple data entries can be simultaneously accessed, which would have not been possible previously. For example, referring to matrix 300 shown in FIG. 3 and the corresponding layout 400 of data in a memory bank for a 16×16 array (i.e., a0-a15×a0-p1) shown in FIG. 4, a row in the matrix 300 containing a subset 301 comprising four elements <a0,a1, a2,a3> is distributed across four tiles, 401-404, in row 405 in FIG. 4. Similarly, a column in the matrix 300 containing a subset 302<a0,b0,c0,d0> is distributed across different columns of FIG. 4. According to some embodiments, elements are wrapped within the tiles, such that, for example, elements e0, k2, etc., are populated within the layout 400.

It should be understood that when numbers are written in base-n notation, the number "n" is the radix of those numbers. According to an embodiment of the present invention, the radix operation is used to retrieve the row or column from a table. Consider that in FIG. 3, element b2 in the matrix 300 is located in row 1, column 2. When stored in memory, row 1 refers to a tile in the layout of FIG. 4 in row 1 406, and column 2 refers to a tile in the layout in column 3 since the column number is shifted right by one, such that the reference points to tile 406 where element b2 can be written. Thus, element b2 is stored in a tile indexed by <row 1, col 3> (i.e., tile 406). This calculation can be performed by the radix operation. It should be understood that a read operation is the reverse of this operation as described herein.

According to one or more exemplary embodiments of the present invention, in the subarrays, all tiles in a row share the same global word line(s). According to some embodiments, the tiles of a given subarray comprise a collection of cells that share a local row buffer. According to at least one embodiment of the present invention, all subarrays in a bank share a global row-buffer that can be connected to any one of the local row buffers through a plurality of global bit-lines. Without the global row buffer, the speed of the local buffers may be too slow to drive the input/output (IO) drivers.

FIG. 3 illustrates that a matrix 300 accessed column wise suffers a penalty. Placing the matrix 300 in a single sub-array requires precharge, activate, and read operations (or pre-charge, activate, and write) for each row before a given entry in a column can be read (or written to). Global bit lines connecting the subarrays limit read operations in the same column to one element at a time.

Figure 4:
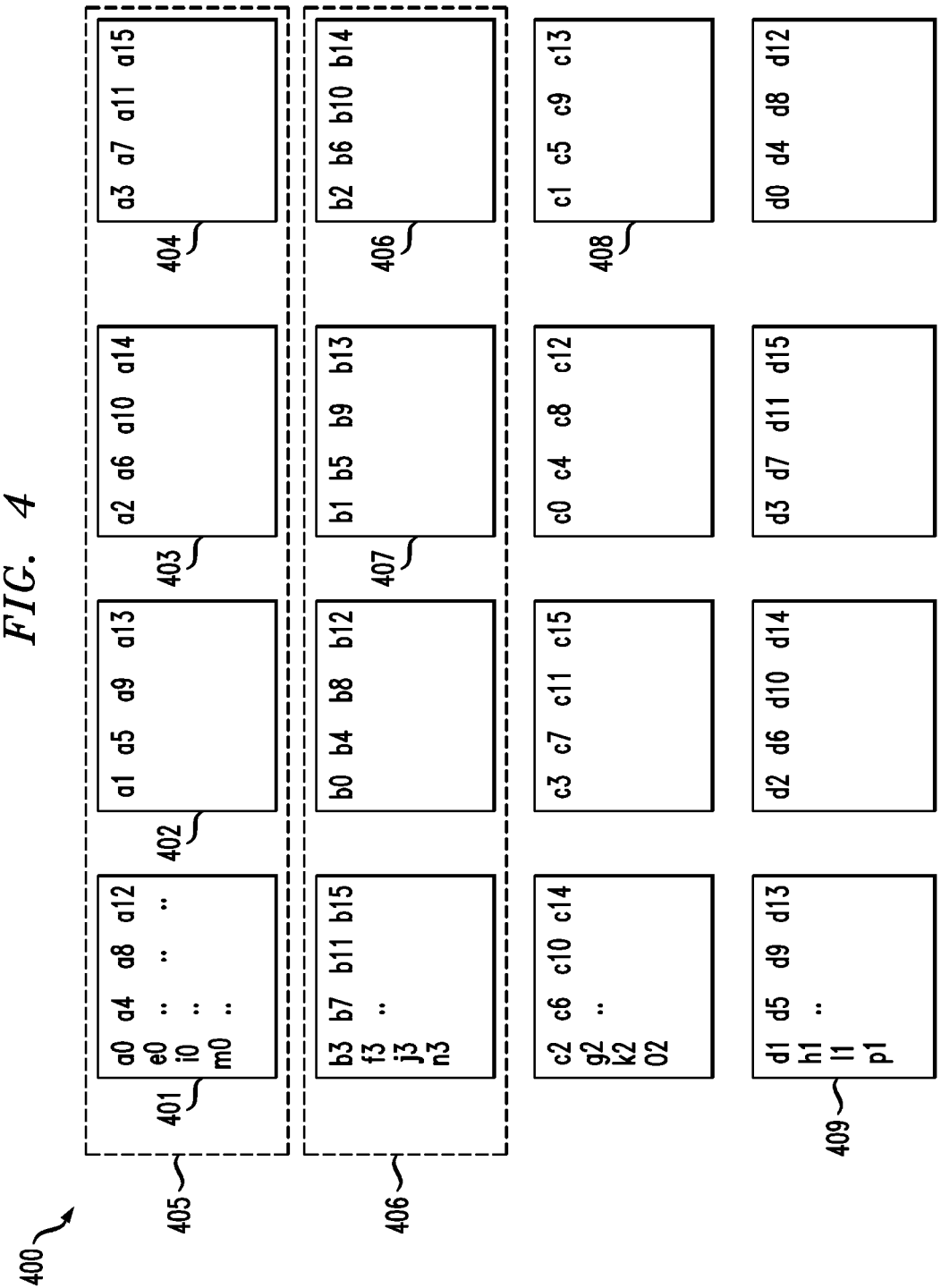
FIG. 4 depicts a layout of data in memory bank for a 16×16 array according to an embodiment of the present invention.

According to one or more exemplary embodiments of the present invention, to overcome the problem of the penalty described in connection with FIG. 3, data is spread to different tiles/segmented subarrays in a particular layout (see for example, FIG. 4). In some embodiments, local row buffers share the global bit lines and the elements are staggered to different columns of memory subarray segments (i.e., tiles) in the bank. According to one or more exemplary embodiments of the present invention, FIG. 4 illustrates a layout 400 of data in a memory bank for a 16×16 array (i.e., a0-a15×a0-p1).

Referring again to FIG. 3, according to some embodiments of the present invention, a given column in the matrix can be translated into a memory address access, which in turn is decoded by a column/row decoder to activate a plurality of columns as needed. A user application can provide a memory address for only a first element in the column and the number of elements in the column to be read, and the remaining memory addresses are computed by a memory controller using this information.

FIG. 5 illustrates a conflict in a same column, with data output from tiles 501, 502 and 503 being conflicted on the global data line 505 by operations on tile 504. In the configuration shown in FIG. 5, it should be understood that tiles 501-504, shown as tile group 506, share a column bit line (not shown).

Figure 6:
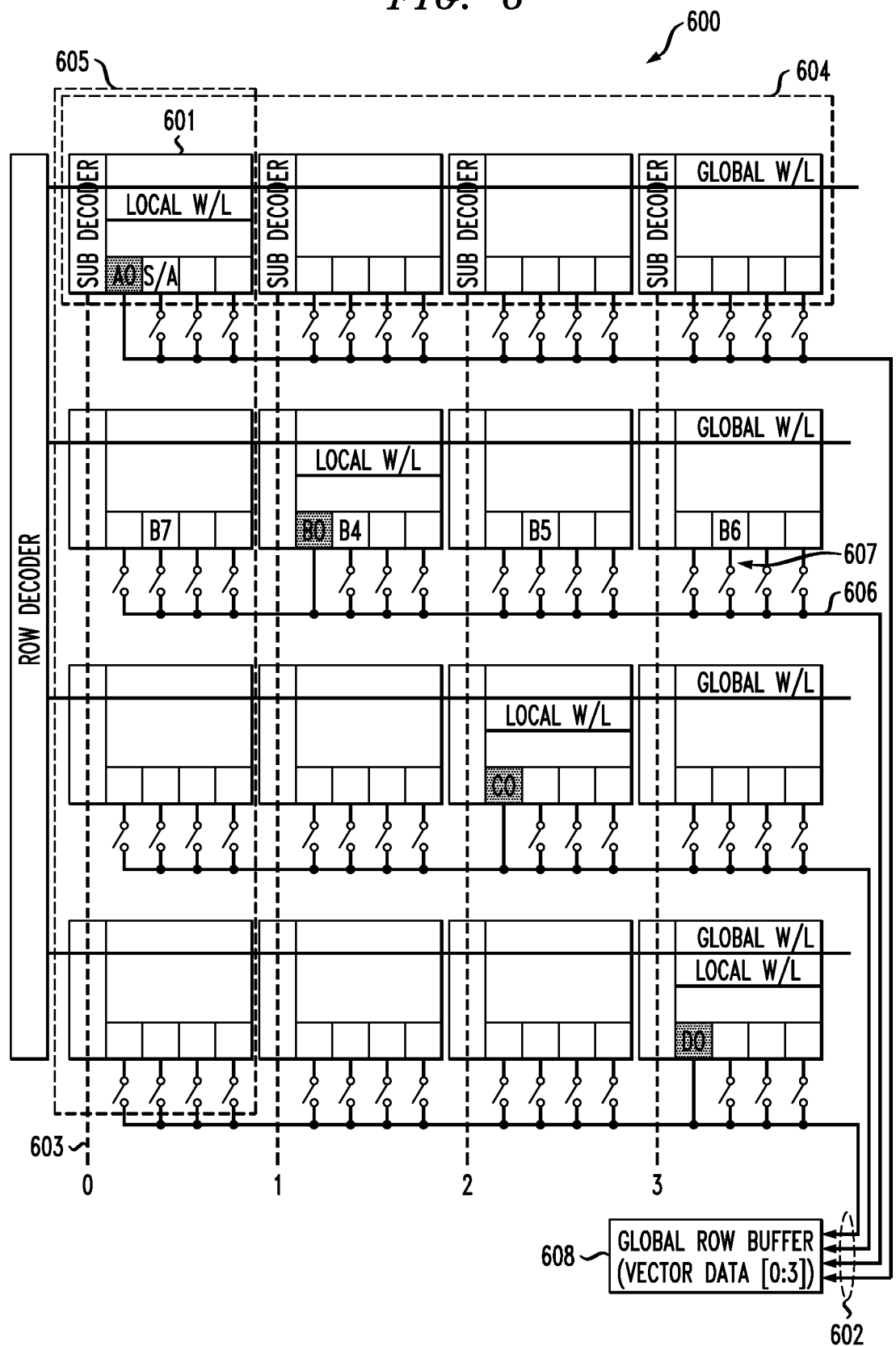
FIG. 6 depicts a read of column 0 according to an embodiment of the present invention.

FIG. 6 illustrates a portion of a bank 600 and a reading operation for column 0 (i.e., tiles (A0,B0,C0,D0)) according to one or more exemplary embodiments of the present invention. In FIG. 6, each row of unit arrays, e.g., 604, has its own global data line (see global data lines 602). Further, according to at least one embodiment of the present invention, a block selection signal, e.g., "0" 603, (and associated wiring) is configured to select a unit array from each column of unit arrays (e.g., 605), such that data from a set of tiles (e.g., tiles (A0,B0,C0,D0)) can be addressed and read out in parallel (see vector data [0:3] output to global row buffer 608).

Figure 7:
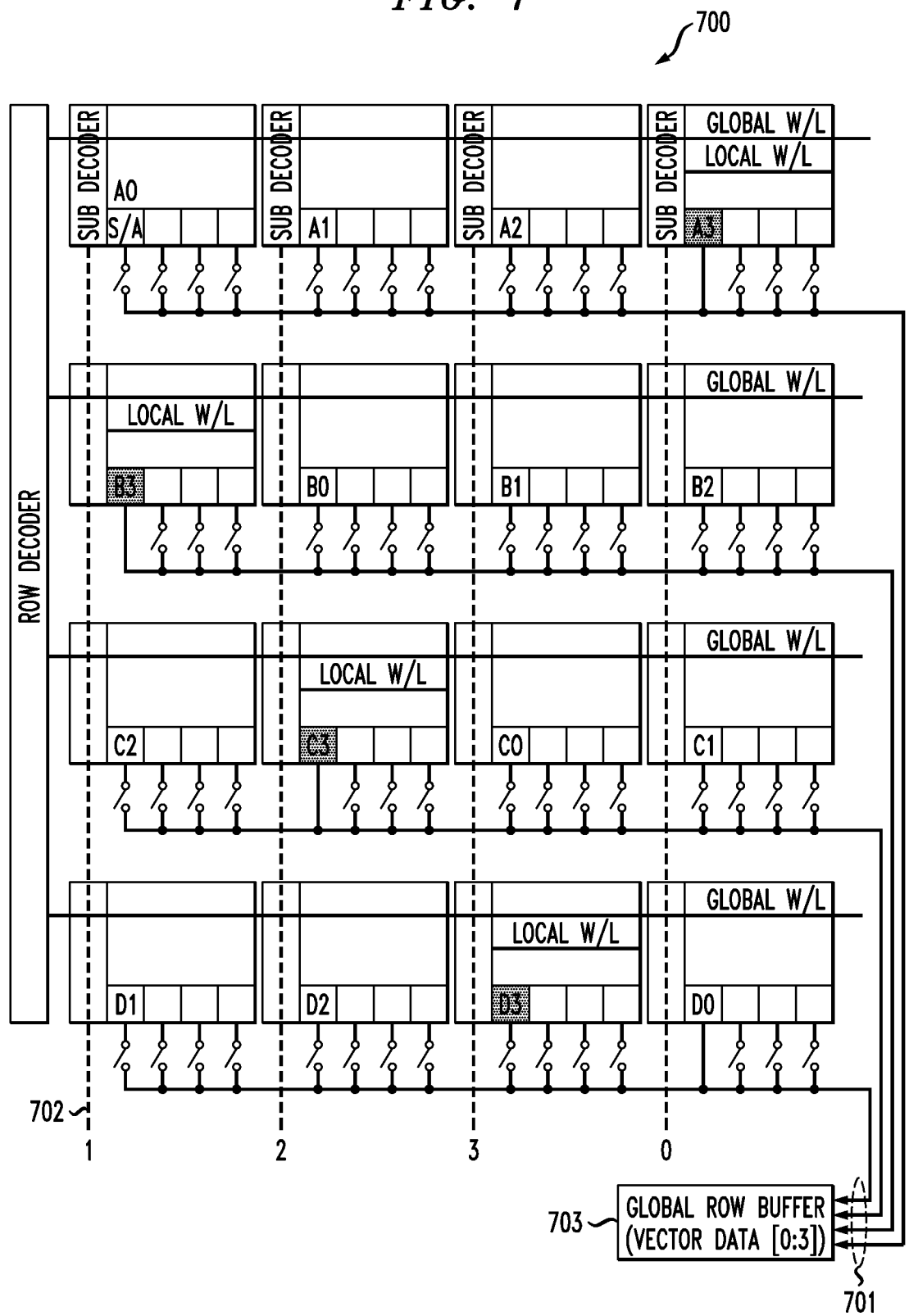
FIG. 7 depicts a read of column 3 according to an embodiment of the present invention.

FIG. 7 illustrates a portion of a bank 700 and a reading operation for column 3 (i.e., (A3,B3,C3,D3)) according to one or more exemplary embodiments of the present invention. In FIG. 7, each row of unit arrays has its own global data line (see global data lines 701). Further, according to at least one embodiment of the present invention, block selection signals, e.g., "1" 702, (and associated wiring) are configured to select a unit array from each column of unit arrays, such that data from a set of tiles (e.g., tiles (B3,C3,D3,A3)) can be addressed and read out in parallel (see vector data [0:3] output to global row buffer 703).

Figure 8:
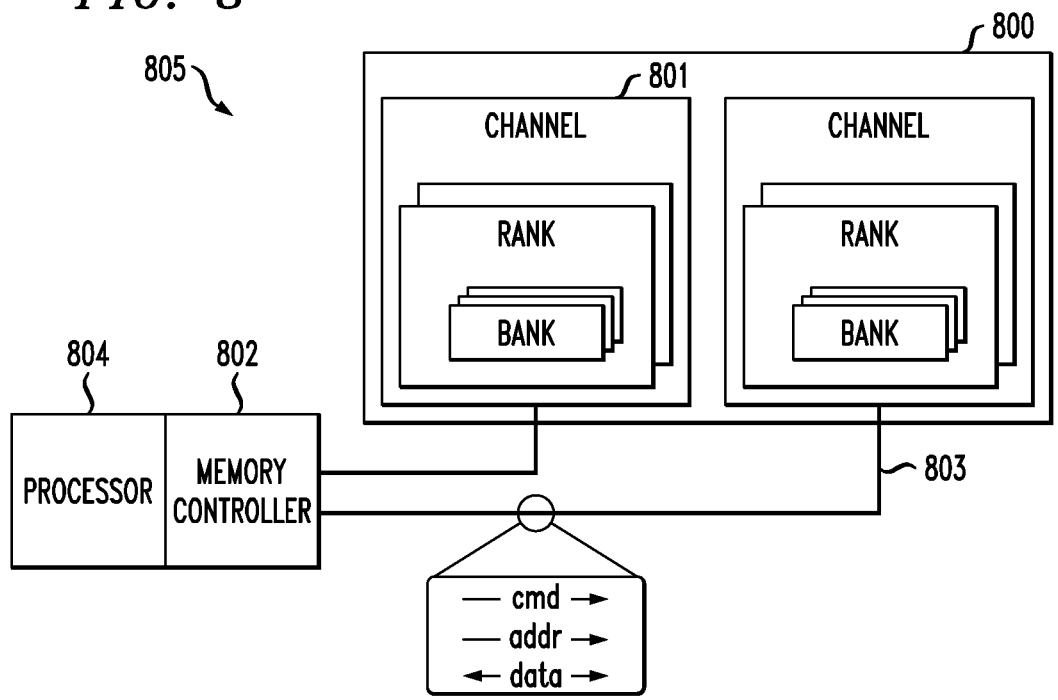
FIG. 8 depicts a logical hierarchy of main memory.

According to one or more exemplary embodiments of the present invention, FIG. 8 shows an exemplary logical hierarchy of main memory 800 in which channel 801 interfaces comprise:

a cache line having 128 bytes (B) of memory spanning tiles <a0,a1,a2 . . . a15>;
a DRAM page size of 128 B (1024 bits);
Hybrid Memory Cube (HMC) interface of 32 bits+4 bits ECC=36 bits through-silicon-vias (TSV), per vault
High Bandwidth Memory (HBM) interface of 128 bits;
DDR4 (Double Data Rate fourth-generation) interface=64 bits+8 bits ECC=72 bits;
Modified DDR interface=vector data[0:3]=32B+4B ECC=288 bits According to one or more exemplary embodiments of the present invention and referring again to FIG. 4, exemplary row operations for read include:

128 B cache line row 0: <a0,a1,a2,a3,a4,a5,a6,a7, . . . a15>;
read row 0, shift 0<a0,a1,a2,a3> (64 bits×4);
read row 0, shift 0<a4,a5,a6,a7>;
read row 0, shift 0<a8,a9,a10,a11>;
read row 0, shift 0<a12,a13,a14,a15>;
128 B Cache line read row 1<b0,b1,b2,b3,b4,b5,b6,b7, . . . b15>;
read row 1,shift 1<b3,b0,b1,b2>=><b0,b1,b2,b3>;
read row 1, shift 1<b7,b4,b5,b6>=><b4,b5,b6,b7>;
read row 1, shift 1<b11,b8,b9,b10>=><b8,b9,b10,b11>;
read row 1, shift 1<b15,b12,b13,b14>=><b12,b13,b14,b15>.

Referring to FIG. 3 and FIG. 4, when data is moved from memory having the layout illustrated in FIG. 4 to a cache (e.g., between a CPU and memory), the data is rearranged into a matrix as illustrated in FIG. 3. The data in cache line row 0 is laid out as <(a0,a4,a8,a12) (a1,a5,a9,a13) (a2,a6,a10,a14) (a3,a7,a11,a15)>. Further, the data in read row 0, shift 0 (i.e., <a0,a1,a2,a3>) is retrieved and assigned to the first element from tiles 401-404. No shift is used, as this is row 0 (shift 0). Data <a4,a5,a6,a7> is retrieved from the second element of each of tiles 401-404 in the first row 405. Again no shift is used (shift 0). Similar operations are performed for <a8,a9,a10,a11> and <a12,a13,a14,a15>.

Reading the second cache line row 1<b0,b1,b2,b3,b4,b5, . . . , b15> uses the shift operation according to one or more embodiments of the present invention. In memory the second cache line row 1 is laid out in tiles belonging to a second row 406 in FIG. 4 as <(b3,b7,b11,b15) (b0,b4,b8,b12) (b1,b5,b9,b13) (b2,b6,b10,b14)>. Reading the data as in the previous case, a first read operation retrieves (b3,b0,b1,b2) from memory. According to some embodiments, the data to be stored in cache, i.e., (b0,b1,b2,b3), is shifted left with the first element, b0, being the last element to be retrieved from memory. This is indicated by read row 1,shift 1<b3,b0,b1,b2>=><b0,b1,b2,b3> above. Reading the next element in each of the subarray tiles of row 406 gives (b7,b4,b5,b6). This vector is shifted left with first element placed at the end giving <b4,b5,b6,b7>. In this way the other elements in the row can be retrieved as well.

According to one or more exemplary embodiments of the present invention and referring again to FIG. 4, exemplary column operations for read include:

column 0:<(a0,b0,c0,d0),(e0,f0,g0,h0),(i0,j0,k0,l0),(m0,n0,o0,p0)>;
read column 0, block 0<a0,b0,c0,d0>;
read column 0, block 1<e0,f0,g0,h0>;
read column 0, block 2<i0,j0,k0,l0>;
read column 0, block 3<m0,n0,o0,p0>;
column 1:<a1,b1,c1,d1,e1, . . . p1>;
read column 1, block 0, shift 1<a1,b1,c1,d1>;
read column 1, block 1, shift 1<e1,f1,g1,h1>;

read column 1, block 2, shift 1<i1,j1,k1,l1>;
read column 1, block 3, shift 1<m1,n1,o1,p1>.

According to some embodiments, referring to FIG. 3, FIG. 4 and FIG. 6, elements <A0,B0,C0,D0> are retrieved from different tiles of the memory as shown in FIG. 6 by activating the tiles starting at row 0, col 0 (i.e., tile A0 in unit array 601) in FIG. 6. Since the elements belong to column 0 of FIG. 3, no further shift is needed. These elements correspond to column 0 in FIG. 3, where column 0 includes elements <a0,b0,c0,d0,e0, . . . , p0>. According to one or more embodiments, by activating the same set of tiles in FIG. 6, and reading a second row in each of these tiles (i.e., block 1), the element set <e0,f0,g0,h0> is read. Since these elements belong to column 0 of FIG. 3, no shift is used for the read operation. Other element sets, e.g., <i0,j0,k0,l0> and <m0,n0,o0,p0>, can be retrieved in a similar fashion.

The indication of "column 1:<a1,b1,c1,d1,e1, . . . p1>" above reads data from memory and stores the data in cache memory. In the cache memory the data is expected to be stored as illustrated in column 1 of FIG. 3, i.e., <a1,b1,c1, d1,e1, . . . p1>. In the memory, the same data is stored across tiles 402, and 407-409, as shown in FIG. 4. A first read operation from the memory layout retrieves <d1,a1,b1,c1>. A shift left by 1 (indicated by the column number in FIG. 3) stores the data in cache memory as <a1,b1,c1,d1>. Similarly, a second read operation reads <h1,e1,f1,g1>, which when shifted left (and wrapped) gives <e1,f1,g1,h1>. Subsequent operations would read the remaining lines indicated by <i1,j1,k1,l1> and <m1,n1,o1,p1>.

Referring to again to FIG. 6, according to one or more embodiments of the present invention, in attempting to read multiple elements in a row serially, e.g., <B7,B4,B5,B6>, the elements are read out to the same local row data line 606. Since there is a collision of the output data on local row data line 606, the output data is read in four cycles. The penalty (e.g., three additional cycles to complete the read operation) is lower than reading the data column wise, as the local row data line 606 is already pre-charged and ready to be read. Note that in FIG. 6, switches connecting tiles <B7,B4,B5, B6> to the local row data line 606 (e.g., switch 607) are illustrated as open, but in the case described above where multiple tiles of the row are read, these switches would be closed as the respective tiles are accessed.

Figure 9:
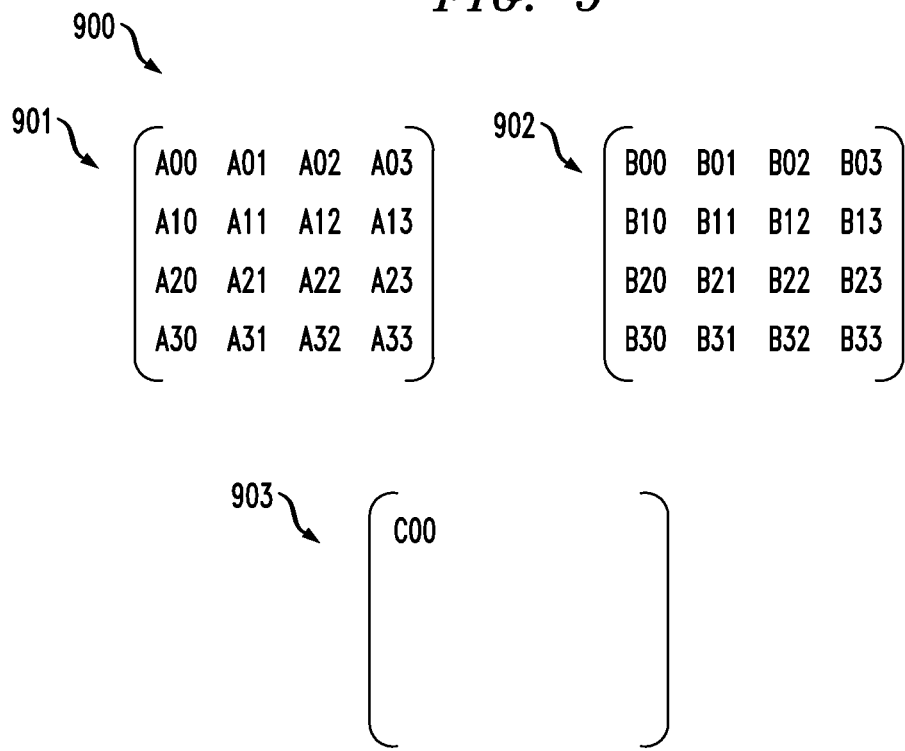
FIG. 9 depicts a use case for of matrix multiplication.

According to one or more exemplary embodiments of the present invention, FIG. 9 illustrates a use case for matrix multiplication; FIG. 9 shows an example of matrix multiplication that could be performed by the user application performing some function. For example:

Read a row of A from memory to cache;
Read a column of B from memory to cache;
Multiple the row of A matrix 901 by the column of B matrix 902;
(A00,A01,A02,A03) multiplied by (B00,B10,B20,B30);
Store result in C00; and
Write resultant C matrix 903 to memory row-wise.

Referring to FIG. 9, for 4×4 matrices 900, matrix multiplication is used to obtain the elements indicated by (A00, A01,A02,A03) from matrix A 901 and (B00,B10,B20,B30) from matrix B 902, and to store a result as C00 in matrix C 903. Given a matrix arranged according to one or more embodiments of the present invention, the individual elements of a row can be retrieved quickly, e.g., read (A00, A01,A02,A03) in one read cycle. Similarly, the elements in any column of B matrix can be retrieved in a single cycle as shown in FIG. 7.

When the row and column are multiplied, a resulting matrix, C00, can optionally be read column-wise. According to at least one embodiment of the present invention, the matrix C00 can be stored in memory conventionally (e.g., in a flat or scalar mode) or in a matrix mode, with a staggered layout.

By way of review and referring to FIG. 9, a user application accesses a single row A[x][ ] and single column B[ ][y] of the matrix, and the compiler/memory controller converts these into a plurality of addresses in the DRAM memory. The memory controller calculates different row decoder/column decoder signals using the requested matrix row of A[x][ ] and matrix column of B[ ][y]. The product of these is a single element, which is written to matrix C. The resulting matrix C only needs one memory address, which can be accessed in regular mode.

According to one or more embodiments, the memory controller 802 is configured to select a row and column in memory based on a row and column of the matrix seen in FIG. 3. In this way the memory controller 802 in matrix mode hides the layout of data in memory from an application user. Note that the memory controller 802 in a regular mode writes data conventionally, without spreading the data to different tiles. The memory controller 802 in the matrix mode spreads data in memory and improves the memory device's bandwidth.

According to one or more exemplary embodiments of the present invention and referring now to the memory controller 802, the memory controller knows the number of sub-arrays and tiles in a sub-array. According to at least one embodiment, the memory controller 802 has the ability to activate multiple segmented-subarrays (tiles). According to some embodiments, the memory controller 802 knows which column of segmented sub-array (tile) to activate. According to an exemplary embodiment of the present invention, the memory controller 802 has the ability to selectively read/write data in regular mode and matrix mode. More particular, a compiler of the application code is assumed to be aware of the architecture and hardware of the system (or systems configured to run the application), and introduces hints into the executable code (or target code) on how the data can be laid out in memory (e.g., in a regular or matrix layout). The memory controller 802 makes use of these hints when running the application and storing data in memory. From a user perspective, an application is coded without change; the application is portable to systems implementing one or more embodiments of the present invention, such as in a case of a DRAM with improved column read bandwidth for accessing data using matrices.

According to at least one embodiment, the memory controller 802 has ability to shift retrieved data or data that is written to memory. According to some embodiments, there are no changes to the programming for reading matrix row/column.

According to one or more embodiments of the present invention, a user application provides hints to the memory controller about how to layout data. In a case where the user application knows in advance that it expects to read data column wise in a matrix, the application can instruct the memory controller to store the data in the matrix mode.

According to one or more exemplary embodiments of the present invention, bandwidth estimates for a memory may depend on the layout in which data is placed in memory. For example, if data is placed in column-major format, and without any hardware improvements, the processor can read one entry in the matrix in each cycle. According to some embodiments, in the case of an improved memory device and method, the data layout yields quadruples (four times) bandwidth.

Column-major format has the limitation that reading a row in large matrixes becomes slow. Row major/column major can improve performance in smaller matrices, where data fits in a global word line. Once the processor needs to access data in a different row, a cost is incurred for closing and opening a new page/row.

If all entries are laid out on different tiles, without staggering, the processor can address only one data element per cycle to avoid collisions on the global bit lines. According to one or more exemplary embodiments of the present invention, the staggering of data layout yields improved bandwidth. According to some embodiments, the bandwidth is proportional to the number of tiles in a sub-array. In an exemplary case with four (4) tiles, each sub-array having 1024 bits in the global word line and each tile comprising of 256 bits in a tile local word line, the 256 bits can hold four (4) uint64 (64 bit numbers).

Figure 10:
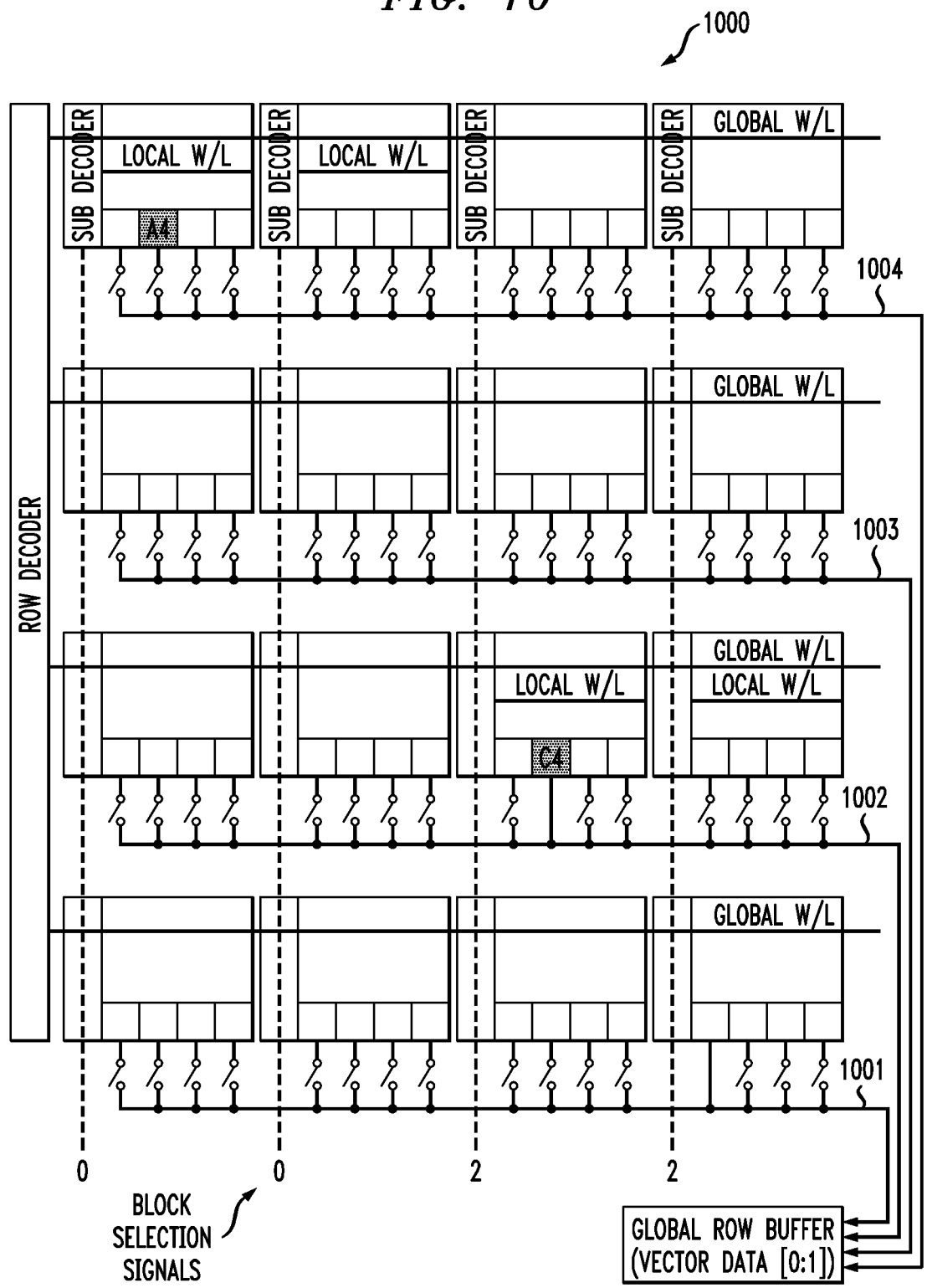
FIG. 10 depicts a half-matrix mode according to an embodiment of the present invention.

FIG. 10 illustrates a portion of a bank 1000 and a half-matrix mode. According to some embodiments of the present invention, partial vectors can be accessed in 2D vector in the half-matrix (or half-bandwidth) mode. In some embodiments, the half-matrix mode is used where only partial data is to be retrieved, instead of the whole row or column. For example, as shown in FIG. 10, using block selection signal 0 on two columns and block selection signal 2 on two other columns would output the data from tiles A4 and C4, respectively.

According to at least one embodiment of the present invention, the number of global data lines can be reduced (e.g., in a half-matrix wiring). For example, a first pair global data lines 1001-1002 and a second pair of global data lines 1003-1004 can each be implemented as a signal global data line (such that the bank 1000 includes two global data lines). In a memory device having such a hardware limitation, the half-matrix mode can be used to read the entire column in two cycles. According to at least one exemplary embodiment, the half-matrix wiring implemented in a chip's physical design can result in a compact wiring layout, as wiring global wires consumes significant area in the memory chip.

Recapitulation:

According to one or more embodiments of the present invention, a method of operating a memory controller performing activation of a memory device, the method including determining a selection signal for each tile column in a memory block of the memory device by activating respective local word lines, wherein the block selection signal is determined by performing a radix n operation on a vector identifying elements to be read or written.

According to an embodiment of the present invention, a memory system 805 comprises a memory device 800 including a plurality of tiles, and a plurality of tile columns connecting respective sets of the tiles, wherein a bandwidth of the memory device is a function of the number of tile columns, the memory system 805 further including a memory controller 802 configured to access elements among the tile columns, wherein in a matrix mode, data is shifted among the tile columns (relative to regular mode).

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of operating a memory controller performing activation of a memory device, the method comprising:
   storing data in a plurality of two-dimensional matrices within the memory;
   performing a software operation on the two-dimensional matrices to determine a column address of data in the memory device;
   determining a selection signal for each tile column in a memory block of the memory device by activating respective local word lines,
   wherein the block selection signal is determined by performing a radix n operation on the column address identifying elements to be read or written.

2. The method of claim 1, further comprising reading, simultaneously, data from a plurality of activated tiles connected to the respective local word lines.

3. The method of claim 2, further comprising selecting the plurality of tiles using the block selection signals applied to the tile columns within the memory and on a plurality of global data lines.

4. The method of claim 2, further comprising outputting the data read from the activated tiles in parallel to a global row buffer.

5. The method of claim 1, wherein the software operation is one or more of a transpose operation and a matrix multiplication operation.

6. The method of claim 1, further comprising operating, selectively, a memory bank of the memory device in a flat mode or a matrix mode.

7. The method of claim 1, further comprising operating, selectively, a memory bank of the memory device in a flat mode or a half-matrix mode.

8. A memory system comprising:
a memory device comprising:
- a plurality of tiles configured into a plurality of subarrays;
- a plurality of global word lines, wherein tiles of the same subarray are connected to the same global word lines;
- a global row buffer; and
- a plurality of global data lines connecting the subarrays to the global row buffer, wherein a bandwidth of the memory device is a function of a number of columns formed by the tiles; and
a memory controller configured to access a plurality of elements among the tile columns in parallel.

9. The memory system of claim 8, wherein the memory device comprises a row decoder configured to simultaneously activate one tile in each subarray in the memory device.

10. The memory system of claim 8, wherein each of the subarrays is connected to a respective one of the global data lines.

11. The memory system of claim 8, wherein two or more of the subarrays share a respective one of the global data lines.

12. A method of operating a memory controller performing a simultaneous activation of a plurality of tiles in a bank of a memory device, the method comprising:
- receiving a row and a column address for cells of the bank to be accessed;
- translating the row and the column address into an address in memory, wherein the address in memory selects a tile in each of at least two subarrays of the bank;
- translating, within each of the selected tiles, the column address into a cell address; and
- activating, simultaneously, the cell address within each of the selected tiles.

13. The method of claim 12, further comprising reading, simultaneously, data from the cell addressed within the selected tiles via a plurality of global data lines connecting the subarrays to a global row buffer.

14. The method of claim 12, further comprising selecting the tiles using the block selection signals applied to columns of the tiles within the memory device.

* * * * *